United States Patent [19]
Alberth, Jr. et al.

[11] Patent Number: 5,589,796
[45] Date of Patent: Dec. 31, 1996

[54] METHOD AND APPARATUS FOR INCREASING AMPLIFIER EFFICIENCY

[75] Inventors: William P. Alberth, Jr., Crystal Lake; John J. Janssen, Round Lake Beach; Armin Klomsdorf, Grayslake, all of Ill.

[73] Assignee: Motorola, Inc, Schaumburg, Ill.

[21] Appl. No.: 332,968

[22] Filed: Nov. 1, 1994

[51] Int. Cl.$^6$ .................................................. H03G 3/30
[52] U.S. Cl. .......................... 330/133; 330/134; 330/279; 330/285; 455/126; 455/127
[58] Field of Search ................................. 330/129, 133, 330/134, 279, 285; 455/116, 126, 127

[56] References Cited

U.S. PATENT DOCUMENTS

| | | | |
|---|---|---|---|
| 4,442,408 | 4/1984 | Le . | |
| 4,924,191 | 5/1990 | Erb et al. . | |
| 5,029,298 | 7/1991 | Chiba et al. | 455/127 X |
| 5,050,235 | 9/1991 | Kojima . | |
| 5,060,294 | 10/1991 | Schwent et al. . | |
| 5,136,257 | 8/1992 | Reading | 330/279 X |
| 5,278,517 | 1/1994 | Fujita | 330/279 |
| 5,278,994 | 1/1994 | Black et al. . | |
| 5,426,641 | 6/1995 | Afrashteh et al. | 330/279 X |
| 5,432,473 | 7/1995 | Mattila et al. | 330/133 |
| 5,452,473 | 9/1995 | Weiland et al. | 455/126 X |

FOREIGN PATENT DOCUMENTS

WO9211702  7/1992  WIPO .

Primary Examiner—James B. Mullins
Attorney, Agent, or Firm—Rolland R. Hackbart

[57] ABSTRACT

A transmitter (107) includes amplifying circuitry (203) and control circuitry (215, 217, 219) for biasing the amplifying circuitry (203) so that it operates closer to saturation with increased efficiency. The gate voltage signal (213), which provides a gate bias, is coupled to the amplifying circuitry (203) and is dynamically varied by the processor circuitry (219) in response to the value of the amplifier control voltage (211) coupled to the amplifying circuitry (203). The amplifier control voltage (211), which has a value for maintaining the output power of the amplifying circuitry (203) at a constant, is produced by the integrating circuitry (217) in response to a comparison of the detected power output signal (216) produced by the detecting circuitry (215) and the power output control signal (218) produced by the processor circuitry (219). Efficiency is realized by dynamically varying the gate voltage signal (213) to its largest magnitude so that the amplifying circuitry (203) may operate as close to saturation as possible while still maintaining a constant output power.

13 Claims, 5 Drawing Sheets

METHOD AND APPARATUS FOR INCREASING AMPLIFIER EFFICIENCY

FIELD OF THE INVENTION

This invention relates generally to amplifiers and, more specifically, to a method and apparatus for improving the efficiency of an amplifier.

BACKGROUND OF THE INVENTION

Consumer demands have fueled technological advances in the area of electronics. Through aggressive development and manufacturing, the industry has accomplished increased miniaturization of electronic components resulting in the advent of extremely lightweight and dimensionally constrained hand held portable electronic devices. Such devices, including portable radiotelephones, are typically battery powered. The operational longevity of the radiotelephone based on its associated battery life often becomes a fundamental consumer selling point. In order to maximize battery use and, thus, satisfy consumer demands, the radiotelephone must be developed to optimize power consumption.

Essential to the operation of the radiotelephone, as well as to other two-way communication devices, is an amplifier. An amplifier is utilized to amplify radio frequency (RF) signals for transmission so as to permit the radiotelephone to communicate with a fixed site transceiver, which, in turn, is interfaced between the landline telephone system and other multiple, portable, or mobile radiotelephone systems contained within a geographic area. Existing amplifiers typically utilize amplifying elements comprised of a FET (Field Effect Transistor). Recently, the industry has shifted away from utilizing a silicon MOSFET (metal oxide semiconductor FET) and toward utilizing a gallium arsenide FET for increased efficiency. The gallium arsenide FET is biased into operation via the application of a negative voltage to the gate thereof.

To facilitate design and manufacturability of radiotelephones utilizing gallium arsenide FETs, the gate voltage required to bias the gallium arsenide FET into operation is typically set to a constant negative voltage. The amplifier of the radiotelephone may utilize as much as 500 mA of current to amplify RF signals to output power levels on the magnitude of 29 dBm. Thus, the amplifier must be operated as efficiently as possible so as to make battery-powered handheld radiotelephones feasible.

Therefore, what is needed is a method and apparatus for increasing the efficiency of amplifiers, especially those amplifiers utilizing gallium arsenide FET amplifying elements.

DETAILED DESCRIPTION OF THE PREFERRED EMBODIMENTS

The present invention encompasses a transmitter having amplifying circuitry for amplifying an input signal into an amplified output signal and control circuitry for controlling the amplifying circuitry. The amplifying circuitry is coupled to a power source and has a first, a second, and a third input, an output, a saturation point, an amplification magnitude responsive to a voltage of an amplifier control signal, and a gate bias responsive to a gate voltage signal. The control circuitry comprises detecting circuitry for detecting the output power level of the amplified output signal, integrating circuitry, responsive to the detecting circuitry, for generating the amplifier control signal for setting the amplification magnitude of amplifying circuitry so that the output power level of the amplified output signal remains at a predetermined constant level, and processor circuitry for dynamically varying the gate voltage signal to its largest operative magnitude permitting the amplifying circuitry to function at or near the saturation point for increased efficiency.

Figure 1:
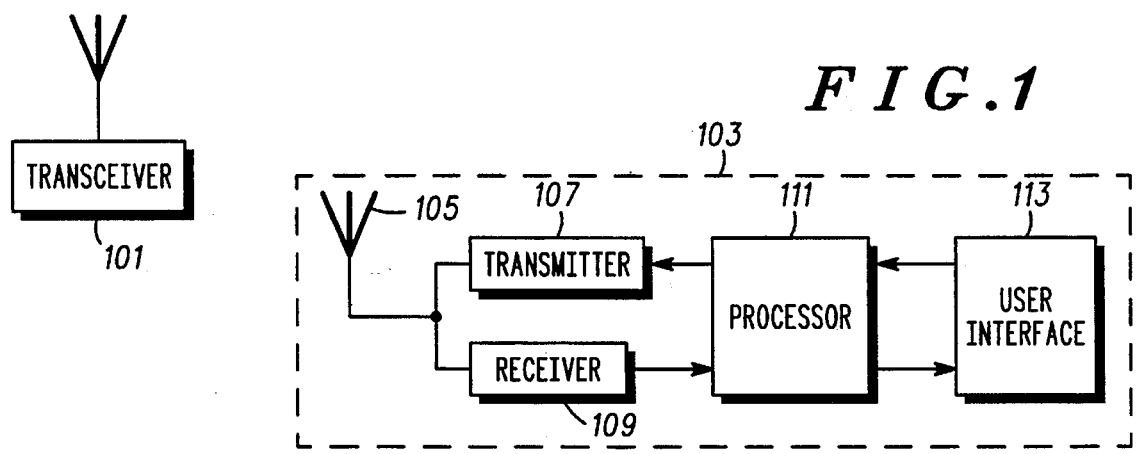
FIG. 1 is a block diagram illustrating a radiotelephone communications system that may employ the present invention.

FIG. 1 is a block diagram illustrating a radiotelephone communications system that may employ the present invention. A radiotelephone system typically includes a fixed transceiver 101 that sends out RF (radio frequency) signals to portable and mobile radiotelephones contained within a geographic coverage area. One such phone is a portable radiotelephone 103.

The portable radiotelephone 103, such as model number F19UVD0960AA available from Motorola, Inc., includes an antenna 105, a transmitter 107, a receiver 109, a processor 111, and an user interface 113.

The antenna 105 is used to transmit and receive RF signals to and from the fixed transceiver 101. Upon receiving signals, the antenna 105 converts the signals into electrical RF signals and transfers the signals to the receiver 109. The receiver 109 demodulates the received electrical RF signals, converts the demodulated RF signals into data signals, and couples the data signals to the processor 111. The received data signals, which are now usable by the rest of the portable radiotelephone 103, may contain control information to be utilized by the processor 111 and/or voice data that may be coupled to a speaker contained with the user interface 113 to provide audible output to a user.

Upon transmission of RF signals, the processor 111 may feed the transmitter 107 information to be transmitted as well as control information. The transmitter 107 takes the information to be transmitted and converts it into electrical RF signals. The electrical RF signals are amplified in accordance with the control information via an amplifier contained within the transmitter 107. The transmitter 107 couples the amplified electrical RF signals to the antenna 105 which converts the electrical RF signals into RF signals for transmission into the air for use by the fixed transceiver 101.

Figure 2:
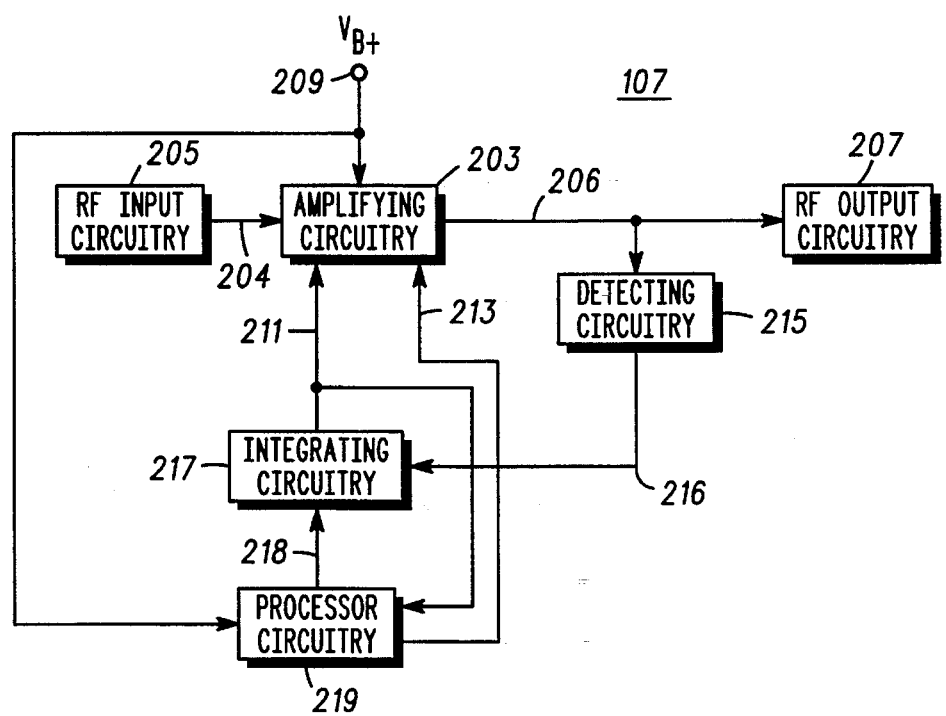
FIG. 2 is a block diagram illustrating a transmitter having amplifying circuitry and corresponding control circuitry that may employ the present invention.

FIG. 2 is a block diagram illustrating the transmitter 107 having amplifying circuitry 203 and corresponding control circuitry including, but not limited to, detecting circuitry 215, integrating circuitry 217, and processor circuitry 219, that may employ the present invention. The circuitry that may embody the functional blocks, as better illustrated in FIGS. 3 and 4 below, may be disposed upon one or more circuit boards and housed within a housing of any portable RF communication device, such as the radiotelephone 103.

The amplifying circuitry 203 contains at least one amplifying element, preferably a gallium arsenide FET (Field Effect Transistor). A power source 209, such as a battery, is denoted by VB+ and supplies power to the amplifying circuitry 203. Although the battery comprising the power source 209 may be fabricated to provide a particular voltage, such as 6.0 V, when nominally charged, the amplifying circuitry 203 must be capable of functioning when the battery has significantly discharged to a voltage less than the particular voltage.

The amplifying circuitry 203 amplifies an RF input signal 204 provided by RF input circuitry 205 (typically containing voice and data to be transmitted) into an amplified RF output signal 206. The RF input signal 204 is amplified such that the amount of power in the RF output signal 206 corresponds to one of a plurality of predetermined power output levels which define the operation of the transmitter 107. The amplifier circuitry 203 subsequently outputs the RF output signal 206 to RF output circuitry 207.

The block diagram of FIG. 2 contains several control loops, including an output power control loop and a gate bias control loop that are interrelated to maximize the efficiency of the operation of the amplifying circuitry 203. Common to the operation of the output power control loop and the gate bias control loop is the processor circuitry 219. It should be noted that although the transmitter 107 utilizes the integral processor circuitry 219, the processor-dependent functionality of the transmitter 107 could be solely provided by a device-central processor, such as the processor 111 depicted in FIG. 1.

The output power control loop maintains the amount of power in the RF output signal 206 at a constant level by varying the magnitude of amplification of the amplifying circuitry 203 via an amplifier control signal 211. The output power control loop consists of the detecting circuitry 215, the processor circuitry 219, and the integrating circuitry 217. In addition, the output power control loop functions while the transmitter 107 is in operation.

The detecting circuitry 215 is coupled between the amplifying circuitry 203 and the RF output circuitry 206 as well as to the integrating circuitry 217 to detect the power level of the RF output signal 206. Upon detection, the detecting circuitry 215 creates and outputs a detected power output signal 216 to the integrating circuitry 217. The detected power output signal 216 corresponds to the amount of power in the RF output signal 206.

The processor circuitry 219 is coupled to the integrating circuitry 217 to provide a power output control signal 218 thereto. The power output control signal 218 contains a predetermined value defining the amount of power that should be in the RF output signal 206. The predetermined value is one of a plurality of phasing values that are stored in a memory of the processor circuitry 219 during manufacture.

The integrating circuitry 217 effectively compares the detected power output signal 216 and the power output control signal 218 to ensure consistency between what the amount of power in the RF output signal 206 is, and what it should be. The integrating circuit 217 accordingly adjusts the magnitude of the amplifier control signal 211 to ensure that the amplifying circuitry 203 provides an accurate and constant RF output signal 206.

The gate bias control loop dynamically varies the gate bias of the amplifying circuitry 203 to establish a desired operating point thereof. The gate bias is responsive to a gate voltage signal 213 coupled to the amplifying circuitry 203 by the processor circuitry 219. In the preferred embodiment, the gallium arsenide FET comprising the amplifying element of the amplifier circuitry 203, is biased by a negative voltage; thus, the gate voltage signal 213 consists of a negative voltage. The gate bias control loop comprises the processor circuitry 219, the power source 209, and the amplifier control signal 211. The gate bias control loop may be executed every time there is a power level change, a channel change, or an initial power-up of the radiotelephone 103.

The processor circuitry 219 dynamically varies the negative voltage of the gate voltage signal 213 to cause the amplifying circuitry 203 to operate as close to saturation or as close to, as well as into, class B operation as possible. Class B operation occurs when the operating point of an amplifying element is at an extreme end of its characteristic (i.e., the gate voltage signal 213 is approximately equal to the cutoff voltage defining the saturation point of the amplifying circuitry 203). By controlling the amplifying circuitry 203 such that it operates near saturation, an increase in the efficiency of the operation of the amplifying circuitry 203 is realized in the form of a reduction in current usage.

The processor circuitry 219 controls the amplifying circuitry 203 to sustain operation near saturation by increasing or decreasing the negative voltage of the gate voltage signal 213. The amplifying circuitry 203 can be considered to be operating near the saturation point when the magnitude of the amplifier control signal 211 is within a predetermined value of the magnitude of the power source 209. By coupling the amplifier control signal 211 and the power source 209 to the processor circuitry 219, the processor circuitry 219 is able to determine if the amplifying circuitry 203 has become too close to the point of saturation and, if so, adjust the negative voltage of the gate voltage signal 213 to a less negative value to prevent saturation. Operating an amplifier in saturation is typically undesired, as damage to some properties of the amplifying elements may occur, subsequently reducing the efficiency of the amplifying circuitry's operation.

While concerned with preventing saturation, the processor circuitry 219 is equally concerned with adjusting the amplifying circuitry 203 to operate as close to the saturation point as possible to achieve increased amplifier efficiency. When the amplifier control signal 211 is not within the aforementioned predetermined value describing the point of saturation, the processor circuitry 219 adjusts the voltage of the gate voltage signal 213 to a more negative value.

Because the amount of power in the RF output signal 206 will decrease as the amplifying circuitry 203 nears, or goes into, saturation, the output power control loop and the gate bias control loop are interrelated such that the output power control loop is able to maintain the amount of power in the RF output signal 206 at a constant level while the gate bias control loop dynamically varies the gate voltage signal 213 to the most negative allowable voltage causing the amplifying circuitry 203 to operate closer to saturation and with increased efficiency.

In addition, by dynamically varying the gate voltage signal 213 in the aforementioned fashion, the present invention is better capable of maintaining the necessary constant amount of power in the RF output signal 206 under worst case temperature or insertion loss conditions with respect to the gallium arsenide FET amplifiers of current transmitters that function at a set negative gate voltage.

Figure 3:
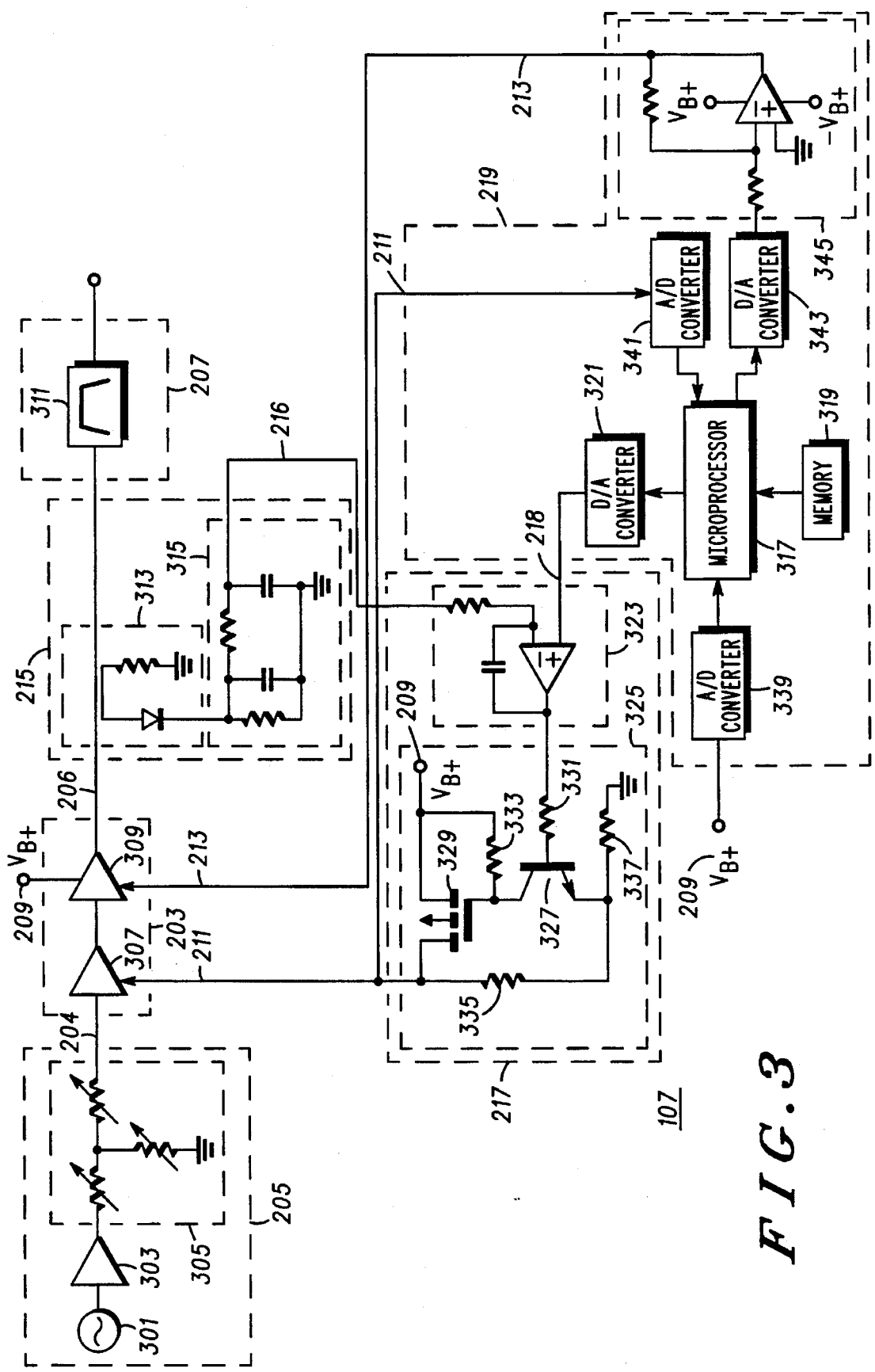
FIG. 3 is a schematic diagram illustrating a transmitter having amplifying circuitry and corresponding control circuitry that may employ the present invention.

FIG. 3 is a schematic diagram further illustrating the transmitter 107 having amplifying circuitry 203 and corresponding control circuitry including, but not limited to, detecting circuitry 215, integrating circuitry 217, and processor circuitry 219 that may employ the present invention. FIG. 3 more specifically defines the components of the transmitter 107 including the amplifying circuitry 203 and the control circuitry that maintains the output power control loop and the gate bias control loop so as to permit efficient operation of the amplifying circuitry 203.

The amplifying circuitry 203, which is multi-stage, receives the RF input signal 204 from the RF input circuitry 205. The RF input signal 204 is comprised of a frequency modulated information signal generated by the RF input circuitry 205. The RF input circuitry 205 receives an electrical information signal consisting of converted voice signals typically supplied by the user of the radiotelephone 103 via a microphone (not shown) or data signals. AVCO (Voltage Controlled Oscillator) 301 combines the information signal with an oscillating signal of a certain frequency to create the frequency modulated information signal. The frequency modulated information signal is then coupled to a buffer 303 that functions both as a filter, typically a passband filter, and an amplification device that increases the magnitude of the frequency modulated information signal. Prior to amplification by the amplifier circuitry 203, the RF input signal 204 is coupled through a variable attenuator 305 comprised of variable resistors. The variable attenuator 305 can be adjusted to provide high attenuation when the transmitter 107 is not transmitting or low attenuation to permit transmission of the RF input signal 204.

The RF input signal 204 is coupled to a power amplifier driver 307 that forms an initial stage of the amplifying circuitry 203. The power amplifier driver 307 amplifies the RF input signal 204 to a magnitude dictated by the amplifier control signal 211, which is exclusively coupled to the power amplifier driver 307. In the preferred embodiment, the power amplifier driver 307, responsive to the amplifier control signal 211, is capable of amplifying the RF input signal 204 from a power level of about +8 dBm to a power level as high as about +17 dBm.

A power amplifier 309 is coupled to an output of the power amplifier driver 307 and forms a final stage of the amplifying circuitry 203. Upon receiving the RF input signal 204, now amplified, from the power amplifier driver 307, the power amplifier 309 additionally amplifies the RF input signal 204 to a power level as high as about +30 dBm. The power amplifier 309 is biased into operation via the application of the gate voltage signal 213. In the preferred embodiment, the power amplifier 309 is a gallium arsenide FET that requires a negative biasing voltage between about 0 V and −5.4 V for operation. The RF input signal 204, now having been amplified by the power amplifier driver 307 and the power amplifier 309 to a level suitable for transmission via an antenna (such as antenna 105 of FIG. 1), is output from the amplifying circuitry 203 in the form of the RF output signal 206. Prior to transmission, the RF output signal 206 may be filtered by a duplexing band-stop filter 311 of the RF output circuitry 207.

The output power control loop maintains the amount of power in the RF output signal 206 at a constant level by varying the amplifier control signal 211, which directly controls the magnitude of amplification of the amplifying circuitry 203. As specified, the output power control loop consists of the detecting circuitry 215, the processor circuitry 219, and the integrating circuitry 217.

Coupled between the amplifying circuitry 203 and the RF output circuitry 207 is the detecting circuitry 215 for detecting the power level of the RF output signal 206 prior to filtering by the RF output circuitry 207. The detecting circuitry 215 includes a directional coupler 313. The directional coupler 313 includes an electromagnetic coupler which couples the RF output signal 206 to a detector 315 without causing excessive loss to the RF output signal 206. The directional coupler 313 also includes a resistor and a diode for directing the coupled RF output signal 206 to the detector 315. The detector 315, a low pass filter, effectively outputs the detected power output signal 216 having a voltage that corresponds to the amount of power in the RF output signal 206. The detected power output signal 216 is then coupled to the integrating circuitry 217.

In order to maintain the amount of power in the RF output signal 206 at a constant level, the output power control loop is dependent on the processor circuitry 219 to provide the power output control signal 218. The power output control signal 218, which is comprised of a voltage corresponding to the amount of power that should be contained in the RF output signal 206, is produced by a microprocessor 317, such as a 68HC11 microcontroller available from Motorola, Inc., contained within the processor circuitry 219. First, the microprocessor 317 determines which one of the plurality of predetermined power output levels the transmitter 107 should be operating at by discerning a power control instruction (not shown) sent by the fixed transceiver 101 (see FIG. 1).

Second, the microprocessor 317 accesses phasing values stored in an associated memory 319 in order to set the voltage of the power output control signal 218. During the manufacture of the radiotelephone 103 phasing values are programmed into the memory 319. The stored phasing values typically consist of the plurality of predetermined power output levels. Each of the plurality of predetermined power output levels are associated with an actual power value that defines the amount of power that should be contained in the RF output signal 206 after amplification in accordance with the particular predetermined power output level. For example, 80(hex) could correspond to 27.5 dBm. The microprocessor 317 is able to retrieve the actual power value from among the phasing values stored in the memory 319 by referencing the predetermined power output level with the power output level dictated by the power control instruction. The microprocessor 317 sets the voltage of the power output control signal 218 to correspond to the retrieved actual power value.

The power output control signal 218 output by the microprocessor 317 is passed through a first digital-to-analog (D/A) converter 321 prior to being coupled to the integrating circuitry 217. The first digital-to-analog (D/A) converter 321 converts the digital power output control signal 218 output by the microprocessor 317 into an analog power output control signal 218 that can be discerned by the integrating circuitry 217.

The integrating circuitry 217 controls the amount of power in the RF output signal 206 by varying the amplifier control signal 211 in response to the comparison of the detected power output signal 216 and the power output control signal 218. The integrating circuitry 217 includes an integrator 323 for comparing the detected power output signal 216 and the power output control signal 218. The detected power output signal 216 and the power output control signal 218 are coupled to the respective negative (−) and positive (+) inputs of the integrator 323. If the voltage of the detected power output signal 216 is less than the voltage of the power output control signal 218, the voltage at the output of the integrator 323 is increased. Conversely, if the voltage of the detected power output signal 216 is greater than the voltage of the power output control signal 218, the voltage at the output of the integrator 323 is decreased.

The integrating circuitry 217 further includes a buffer 325 coupled between the output of the integrator 323 and the power amplifier driver 307. The buffer 325 is primarily comprised of an npn transistor 327 and a p-channel enhancement mode MOSFET (Metal Oxide Semiconductor Field Effect Transistor) 329. A resistor 331 couples the base of the npn transistor 327 to the output of the integrator 323. As the voltage at the output of the integrator 323 increases, such as when the detected power output signal 216 is less than the power output control signal 218, the current flowing into the base of the npn transistor 327 increases causing the current flowing into the collector of the npn transistor 327 to increase. The collector of the npn transistor 327 is coupled to the gate of the MOSFET 329.

When the current flowing into the collector of the npn transistor 327 increases, a voltage across a second resistor 333 coupling both the power source 209 and the source of the MOSFET 329 to the gate of the MOSFET 329 increases causing the MOSFET 329 to turn on. Upon turn on, a portion of the drain current of the MOSFET 329 comprising the amplifier control signal 211 flows to the power amplifier driver 307. The power amplifier driver 307 increases the magnitude of amplification of the amplifying circuitry 203 in accordance with the magnitude of the amplifier control signal 211. In addition, another portion of the drain current flows through a third resistor 335 and a fourth resistor 337 generating voltage on the emitter of the transistor 327 tending to turn off the transistor 327.

Alternatively, a decrease in the voltage at the output of the integrator 323 causes the current flowing into the base of the npn transistor 327 to decrease. This, in turn, causes the current flowing into the collector of the npn transistor 327 to decrease further causing the voltage drop across the resistor 333 to decrease. The decrease in the voltage drop across the resistor 333 causes the MOSFET 329 to turn off, reducing the amplifier control signal 211. A reduction in the amplifier control signal causes the power amplifier driver 307 to reduce the magnitude of the amplification of the amplifying circuitry 203.

The gate bias control loop forces the amplifying circuitry 203 to operate as close to saturation as possible without inhibiting the output power control loop from maintaining the necessary amount of power in the RF output signal 206. As previously mentioned, the amplifying circuitry 203 can be forced to function close to saturation by controlling the negative magnitude of the gate voltage signal 213 that supplies the gate of the gallium arsenide FET comprising the power amplifier 309. Because output power decreases as the amplifying circuitry 203 functions closer to saturation, the negative magnitude of the gate voltage signal 213 is dynamically increased or decreased to maintain the required amount of power in the RF output signal 206 and maximize the efficiency of the amplifying circuitry 203.

The microprocessor 317 of the processor circuitry 219 further functions to dynamically increase or decrease the negative magnitude of the gate voltage signal 213 in response to the voltage levels of the power source 209 and the amplifier control signal 211. The voltage levels of both the power source 209 and the amplifier control signal 211 are coupled to the microprocessor 317 via respective analog-to-digital (A/D) converters 339 and 341 contained in the processor circuitry 219. The analog-to-digital converters 339 and 341 translate the continuous, time-varying analog voltages of the power source 209 and the amplifier control signal 211 into discrete digital values discernible by the microprocessor 317.

The microprocessor 317 compares the voltage levels of the power source 209 and the amplifier control signal 211 with respect to a predetermined value stored in the memory 319. If the voltage level of the power source 209 is within the predetermined value of the voltage level of the amplifier control signal 211, the microprocessor 317 determines that a decrease in the negative magnitude of the amplifying circuitry 203 is necessary to prevent the amplifying circuitry 203 from saturating. Alternatively, if the voltage level of the power source 209 is not within the predetermined value of the voltage level of the amplifier control signal 211, the microprocessor 317 determines that an increase in the negative magnitude of the amplifying circuitry 203 may occur to force the amplifying circuitry 203 closer to saturation and thus improve the efficiency of the power amplifier 203.

The microprocessor 317 generates a digital signal corresponding to the previously determined increase or decrease in the negative magnitude of the gate voltage signal 213. The digital signal is output to a second digital-to-analog (D/A) converter 343 of the processor circuitry 219. The digital-to-analog converter 343 converts the digital signal into a proportional positive analog voltage. The positive analog voltage is coupled to the negative input of an operational amplifier comprising an operational amplifier configuration 345.

The operational amplifier configuration 345 inverts and amplifies the positive analog voltage output by the digital-to-analog converter 343. Inversion is necessary because the gallium arsenide FET comprising the power amplifier 309 of the amplifying circuitry 203 is biased into operation by a negative voltage applied to the gate thereof. The values of the resistors contained in the operational amplifier configuration 345 are chosen to amplify the voltage generated by the microprocessor 317 to an appropriate value for biasing the amplifying circuitry 203. The amplified negative analog voltage generated by the operational amplifier configuration 345 is output to the amplifying circuitry 203 as the gate voltage signal 213.

Figure 4:
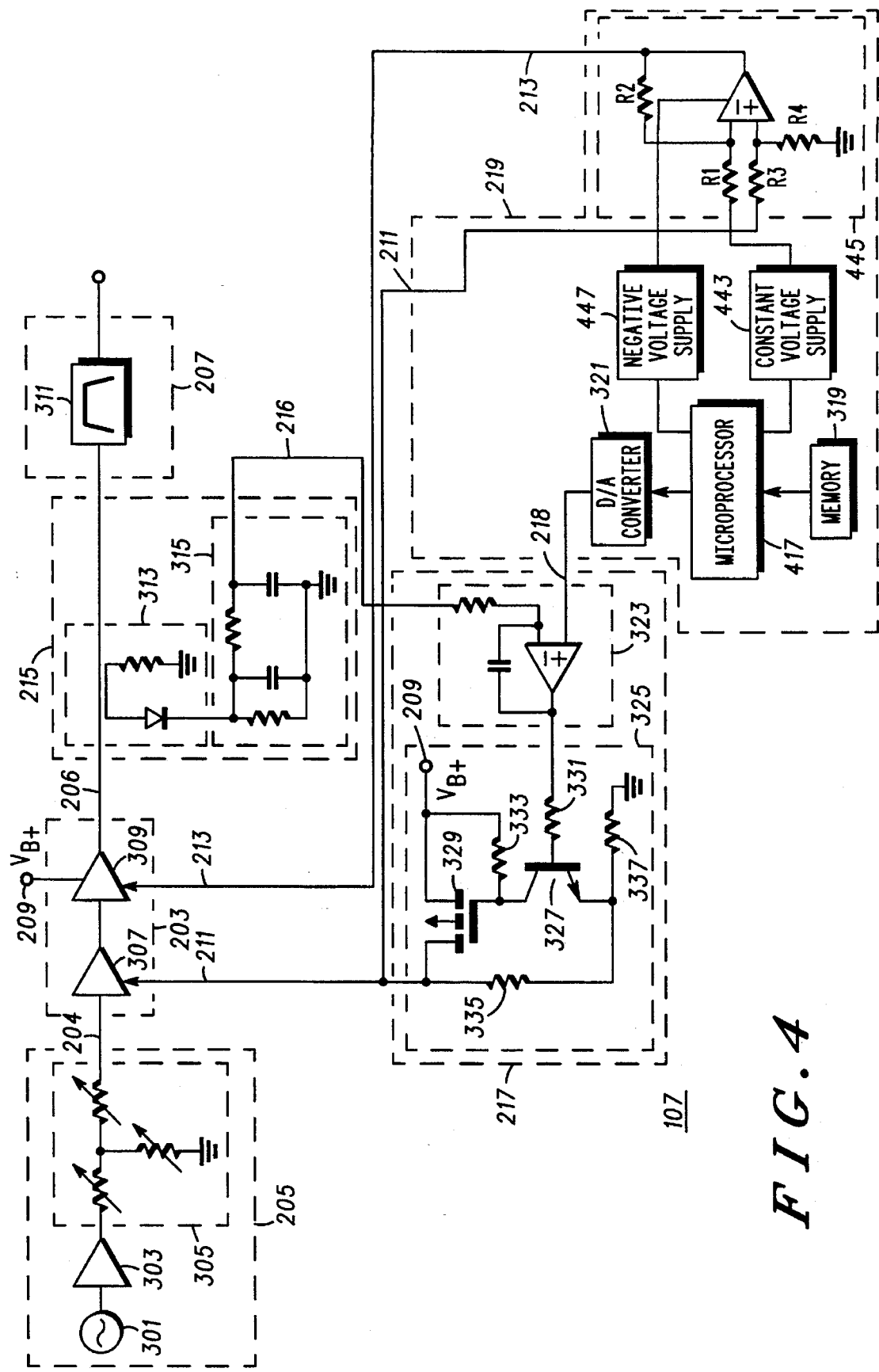
FIG. 4 is a schematic diagram illustrating an alternate embodiment of a transmitter having amplifying circuitry and corresponding control circuitry that may employ the present invention.

An alternate apparatus for generating the gate voltage signal 213 is shown in FIG. 4. FIG. 4 differs from FIG. 3 only with respect to the architecture and the function of the processor circuitry 219. The microprocessor 317 of FIG. 3 generates the voltage corresponding to the gate voltage signal 213 in response to a comparison of the amplifier control signal 341 and the power source 209 coupled thereto. In FIG. 4, no such comparison is necessary; therefore, the processor circuitry 219 of FIG. 4 need not contain the first and second analog-to-digital converters 339 and 341 or the digital-to-analog converter 343 as a microprocessor 417 contained therein does not require inputs from the power source 209 and the amplifier control signal 211. The gate voltage signal 213 is generated by an alternative operational amplifier configuration 445 in direct response to the changing voltage of the amplifier control signal 211 (of the output power control loop).

Although not indirectly generating the gate voltage signal 213, the microprocessor 417 couples a reference voltage through a constant voltage source 443 and a resistor R1 to the negative (−) input of the operational amplifier comprising the operational amplifier configuration 445. In addition, a negative supply voltage 447, controlled by the microprocessor 417, biases the operational amplifier configuration 445.

The gate voltage signal 213 results from a comparison of the reference voltage and the amplifier control signal 211 coupled to the positive (+) input of the operational amplifier comprising the operational amplifier configuration 445. A feedback loop comprised of a resistor R2 is coupled between the output of the operational amplifier and the negative input of the operational amplifier. A resistor divider comprised of resistor R3, also coupled to the positive input of the operational amplifier, and resistor R4, coupled between the positive input of the operational amplifier and ground. As a result, when the output power control loop forces the amplifier control signal 211 to go high so as to increase the amount of power in the RF output signal 206, the gate voltage signal 213 at the output of the operational amplifier becomes less negative to prevent saturation of the amplifying circuitry 203 and make it less difficult for the amplifying circuitry to maintain a constant amount of power in the RF output signal 206. Alternatively, when the output power control loop causes the voltage of the amplifier control signal 211 to go low so as to decrease the amount of power in the RF output signal 206, the gate voltage signal 213 at the output of the operational amplifier becomes more negative to force the amplifying circuitry 203 closer to saturation and increase efficiency.

In the preferred embodiment, the alternative operational amplifier configuration 445 is modeled by the following equation (where $V_{gate}$ refers to the voltage of the gate voltage signal 213 $V_{control}$ refers to the voltage of the amplifier control signal 211, and $V_{ref}$ refers to the voltage of the voltage reference provided by the microprocessor 417):

$$V_{gate} = \frac{V_{control} \times R4}{R3 + R4} - \frac{R2 \times V_{ref}}{R1} + \frac{V_{control} \times R4 \times R2}{R1 \times (R3 + R4)}.$$

Substituting values for the resistors, R1=R2=R3=10K ohms and R4=1K ohms, and the voltage reference, $V_{ref}$=4.75 V, results in the following equation:

$$V_{gate} = V_{control} \times [0.182] - 4.75.$$

Therefore, by making the gate voltage signal 213 dependent on the amplifier control signal 211 in accordance with the aforementioned equation, the amplifying circuitry 203 is able to achieve increased efficiency while maintaining the amount of power in the RF output signal 206 at a constant level.

Experimentation has shown that by dynamically varying the gate voltage signal 213 of the amplifying circuitry 203 in the aforementioned manner results in increased current savings. By dynamically varying the gate voltage signal 213, as opposed to merely setting the gate voltage signal to a constant value in accordance with the prior art, measurements of current drain at ten spots across the transmit band reveal an average savings of approximately 19.2 mA when the gate voltage signal 213 was adjusted to its most negative value while the amount of power in the RF output signal 206 was maintained at a constant value.

Although FIGS. 3 and 4 illustrate coupling the dynamically varying gate voltage signal 213 only to the power amplifier 309, it should be noted that the gate voltages of additional amplifier stages could also be independently dynamically varied in the aforementioned manner for increased efficiency. For example, with respect to FIG. 3, the microprocessor 317 could generate and couple an additional gate voltage through an additional digital-to-analog converter and operational amplifier configuration to the gate of the power amplifier driver 307. With respect to FIG. 4, the variable gate voltage of the power amplifier driver 307 could be generated from a similar alternate operational amplifier configuration comprised of appropriately-valued resistors having the amplifier control signal 211 and a voltage reference coupled to the inputs thereof.

Figure 5:
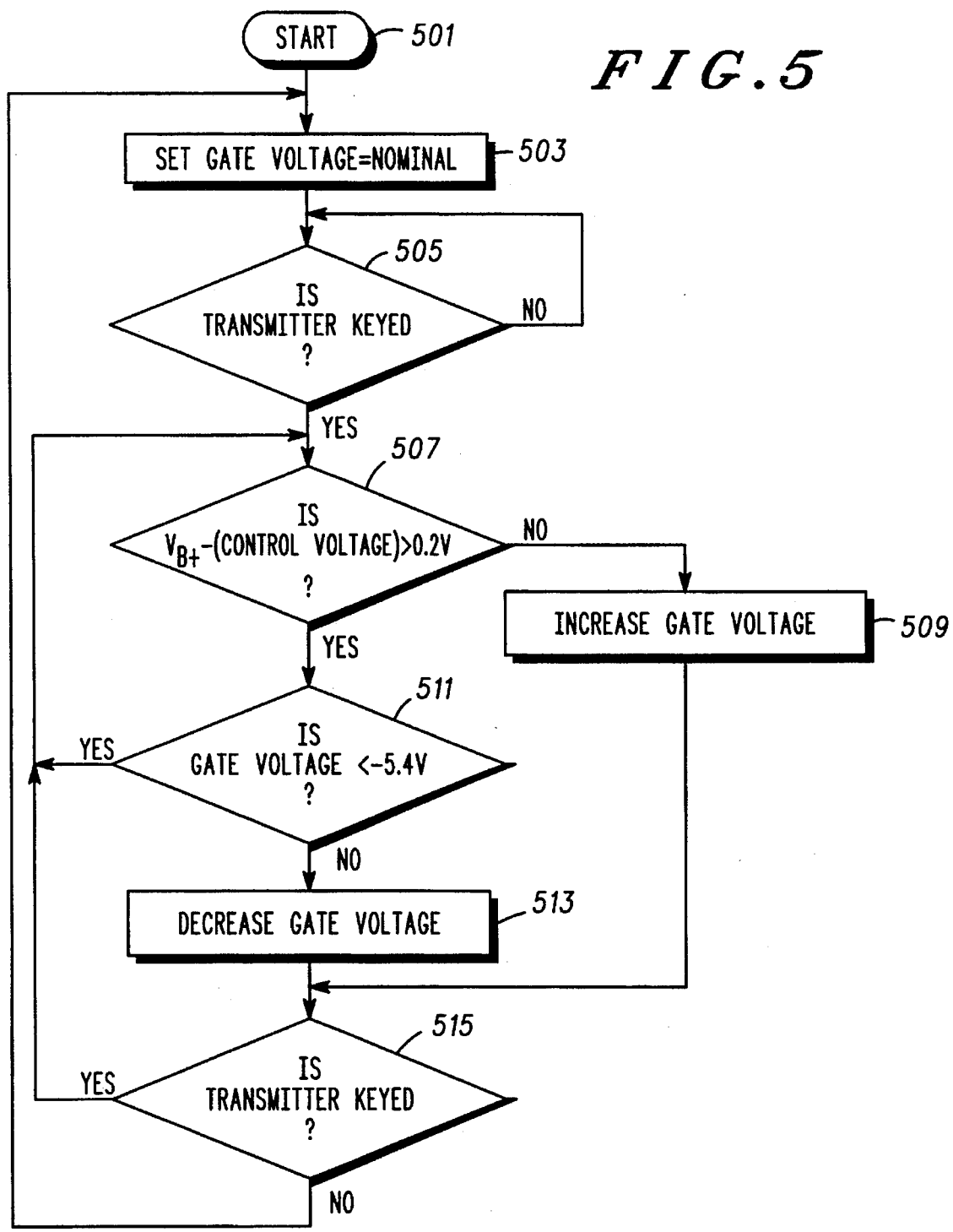
FIG. 5 is a method flow chart of an efficiency algorithm that may employ the present invention.

The aforementioned efficiency may be achieved by employing a preferred algorithm illustrated in the flow chart of FIG. 5. The algorithm may be stored in, and executed by, the processor circuitry 219. After initiating the algorithm at step 501, the processor circuitry 219 sets the gate voltage signal 213 and the gate voltage of the amplifying circuitry 203 to a nominal voltage such as −4 V at step 503. Next, at step 505 the processor circuitry 219 determines if the transmitter 107 is keyed or, in effect, prepared for transmitting. Step 505 is repeated until the transmitter 107 is keyed.

Once the transmitter 107 is determined to be keyed at step 505, the processor circuitry 219 determines whether or not to increase or decrease the gate voltage of the amplifying circuitry 203 so as to increase efficiency. At step 507, the processor circuitry 219 determines whether or not the difference between the voltage of the power source 209, VB+, and the amplifier control voltage 211 ("CONTROL VOLTAGE") is within a predetermined range. In the preferred embodiment, the predetermined range is 0.2 V, which corresponds to the minimum voltage drop across the FET transistor 329 included in the integrating circuitry 217 (see FIG. 3). If the difference between VB+ and CONTROL VOLTAGE is less than or equal to 0.2 V, the gate voltage signal 213 ("GATE VOLTAGE") is increased or made less negative at step 509. In the preferred embodiment, GATE VOLTAGE is increased by 1 or more D/A steps depending on the exact implementation of the algorithm. A larger D/A step will cause faster convergence towards the saturation of the amplifying circuitry 203, while a smaller D/A step will provide greater resolution. This prevents the amplifying circuitry 203 from operating too close to saturation while attempting to increase, or maintain an increased level of, the amount power in the RF output signal 206.

If the difference between VB+ and CONTROL VOLTAGE is greater than 0.2 V, the processor circuitry 219 proceeds to decrease, or make more negative, GATE VOLTAGE forcing the amplifying circuitry 203 to run closer to saturation and, thus, increasing the efficiency of the amplifying circuitry 203. However, prior to decreasing GATE VOLTAGE, the processor circuitry 219 determines if GATE VOLTAGE is already too close to the negative supply minimum voltage at step 511. In the preferred embodiment, the negative supply has a rail, or minimum, of just below −5.4 V. This value may be adjusted depending on the particular negative power supply circuitry used. If GATE VOLTAGE is too close, the processor circuitry 219 returns to step 507. If GATE VOLTAGE is not too close to the negative supply minimum voltage, GATE VOLTAGE is decreased or made more negative at step 513.

After increasing or decreasing GATE VOLTAGE, the processor circuitry 219 once again determines whether or not the transmitter 107 is keyed at step 515. If the transmitter 107 is determined to be keyed, the processor circuitry 219 returns to step 507. If the transmitter 107 is not keyed, the processor circuitry 219 returns to step 503.

Figure 6:
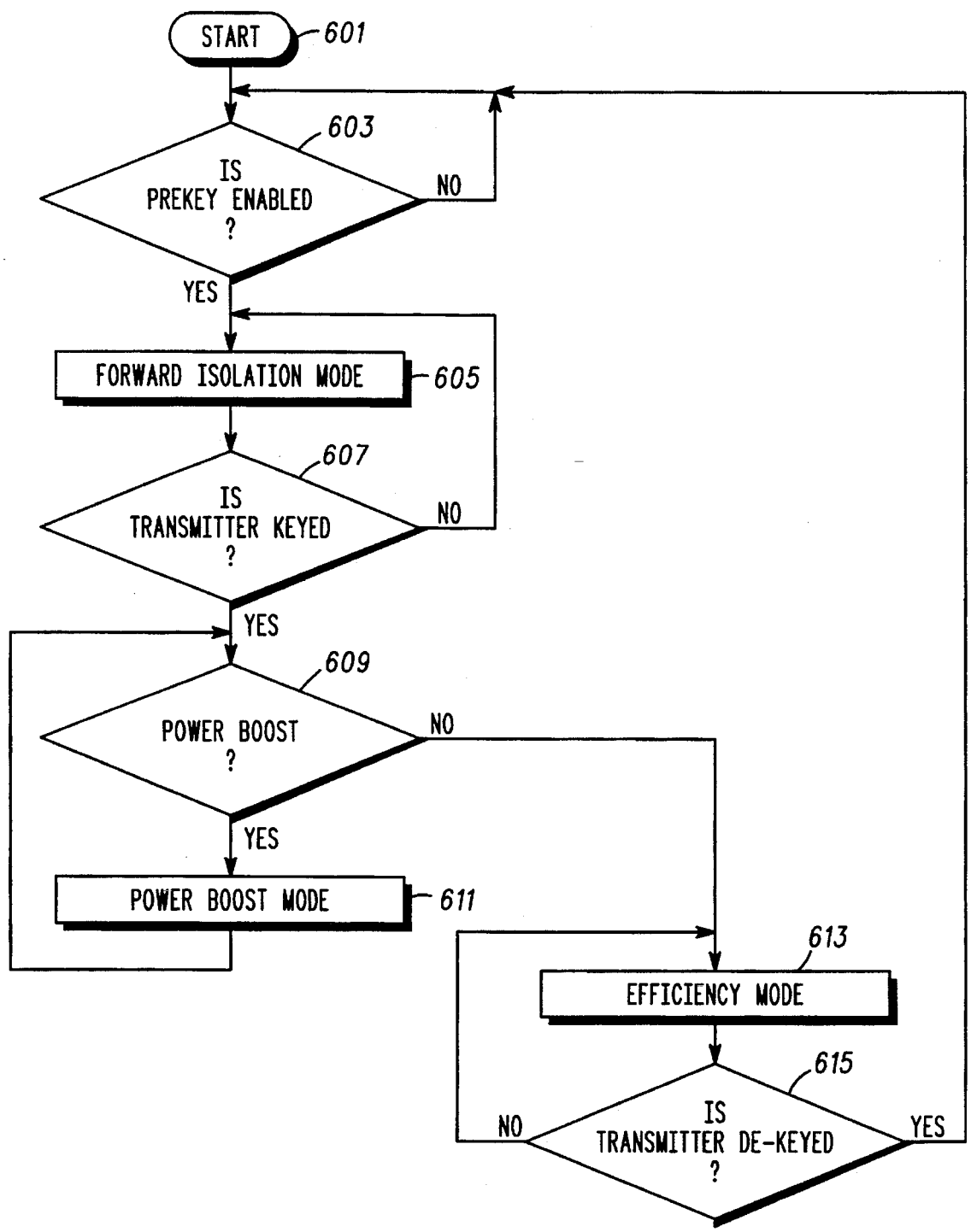
FIG. 6 is a method flow chart of a transmitter control algorithm that may employ the present invention.

FIG. 6 illustrates a transmitter control algorithm that may employ the efficiency algorithm of FIG. 5. The transmitter control algorithm of FIG. 6 may be employed by the processor circuitry 219 of FIG. 2, so as to direct the operation of the transmitter 107. Upon turn-on (of the radiotelephone 103) at step 601, the processor circuitry 219 determines if a transmitter prekey is enabled at step 603. The prekey, which was previously discussed in conjunction with FIG. 4, is a voltage provided by the processor circuitry 219 to provide initial biasing of the amplifier circuitry 203. Until the prekey is enabled, the processor circuitry 219 will not proceed to the next instruction block of the algorithm.

Once the prekey is enabled, the processor circuitry 219 proceeds to step 605 and places the amplifier circuitry 203 into a forward isolation mode. The forward isolation mode increases the attenuation of the RF input signal 204 through the amplifier circuitry 203 by setting the gate voltage signal signal 213 to a value near 0 V.

The processor circuitry 219 then proceeds to determine if the transmitter 107 is keyed at step 607. If the transmitter 107 is not keyed, the processor circuitry 219 returns to step 605. If the transmitter 107 is determined to be keyed, the processor circuitry 219 proceeds to step 609 to determine if a power boost is necessary.

If the radiotelephone 103 struggles to maintain communication with the transceiver 101 (see FIG. 1) due to lack of proximity therewith or obstruction by natural or manmade structures positioned therebetween, the processor circuitry 219 may control the transmitter 107 to boost power. For example, when the cellular radiotelephone 103 is operating at, or outside of, the boundary of coverage of the transceiver 101 (which has no bordering transceiver), the radiotelephone 103 may momentarily boost power above the largest one of the plurality of the predetermined power output levels to maintain communication with the transceiver 101. When such conditions occur, the processor circuitry 219 proceeds to step 611 and enters the power boost mode.

The power boost mode of step 611 causes a momentary increase in the amount of power in the RF output signal 206. This is accomplished through an increase of the power output control signal 218 by the processor circuitry 219, which, in turn, causes an increase in both the amplifier control signal 211 and the amplification of the amplifying circuitry 203. Because the power boost mode consumes a large amount of power, it is preferred that the power boost only occur for a short duration. Upon completion of the power boost, the processor circuitry 219 proceeds to step 609 to determine if the radio is still in power boost mode.

If power boost mode is no longer necessary, the processor circuitry 219 proceeds to step 613 and initiates the efficiency mode. The efficiency mode of step 613 is disclosed in the aforementioned algorithm of FIG. 5 and, thus, will not be reiterated here. Upon exiting from the efficiency mode of step 613, the processor circuitry 219 proceeds to step 615 and determines if the transmitter 107 is de-keyed. If not, the processor circuitry 219 returns to step 613 and re-initiates the efficiency mode. If the transmitter 107 is de-keyed, the processor circuitry 219 returns to step 603 to wait for enabling of the prekey.

In summary, the present invention provides a method and apparatus for increasing amplifier efficiency in the radiotelephone 103. By increasing the negative magnitude of the gate voltage of the gallium arsenide FET comprising the amplifying circuitry so that the amplifying circuitry operates closer to saturation, current savings can be realized. However, because the amplifying circuitry must maintain the amount of power that it outputs at a constant level and operating the amplifier circuitry close to saturation reduces the amount of power that it outputs, the gate voltage must be dynamically varied so as to permit constant output power. Therefore, by utilizing a gate bias control loop, which varies the negative magnitude of the gate voltage, that is subservient to an output power control loop, which functions to maintain constant amplifier output power, the gate voltage can be dynamically varied to its most negative value while constant amplifier output power can be maintained.

Although the invention has been described and illustrated in the above description and drawings, it is understood that this description is by example only and that numerous changes and modifications, such as utilizing a similar method and apparatus with other FET amplifying elements to achieve an increase in efficiency, can be made by those skilled in the art without departing from the true spirit and scope of the invention.

We claim:

1. Control circuitry for controlling amplifying circuitry, the amplifying circuitry for amplifying an input signal into an amplified output signal, the amplifying circuitry coupled to a power source and having a first, a second, and a third input, an output, a saturation point, an amplification magnitude responsive to an amplifier control signal, and a gate bias responsive to a gate voltage signal, the input signal coupled to a first input of the amplifying circuitry, the amplifier control signal coupled to a second input of the amplifying circuitry, the gate voltage signal coupled to a third input of the amplifying circuitry, the amplified output signal having an output power level and coupled to an output of the amplifying circuitry, the control circuitry comprising:

detecting circuitry for detecting the output power level of the amplified output signal, said detecting circuitry coupled to the output of the amplifying circuitry;

integrating circuitry, responsive to said detecting circuitry, for generating the amplifier control signal for setting the amplification magnitude of the amplifying circuitry so that the output power level of the amplified output signal remains at a constant level, said integrating circuitry coupled to an output of said detecting circuitry and coupled to the second input of the amplifying circuitry; and processor circuitry for dynamically varying the gate voltage signal to its largest operative magnitude causing the amplifying circuitry to function at or near the saturation point for increased efficiency, said processor circuitry coupled to said integrating circuitry, the third input of the amplifying circuitry, and to the power source.

2. Control circuitry in accordance with claim 1 wherein said integrating circuitry is further coupled to said processor circuitry such that the amplifier control signal generated by said integrating circuitry consists of an integration of the output power level of the amplified output signal and a power output control signal provided by said processor circuitry.

3. Control circuitry in accordance with claim 1 wherein the amplifier control signal is further coupled to said processor circuitry for determining whether the amplifying circuitry is operating near the saturation point.

4. Control circuitry in accordance with claim 3 wherein determining whether the amplifying circuitry is operating near the saturation point further comprises comparing the difference between the power source and the amplifier control signal to a predetermined value.

5. Control circuitry in accordance with claim 3 wherein said processor circuitry increases or decreases the gate voltage signal responsive to whether the amplifying circuitry is operating near the saturation point.

6. Control circuitry in accordance with claim 1 wherein said processor circuitry further includes an operational amplifier configuration for inverting the gate voltage signal.

7. Control circuitry in accordance with claim 6 wherein said operational amplifier configuration further includes a resistor divider for coupling the amplifier control signal to an input of said operational amplifier configuration as a reference voltage.

8. Control circuitry for controlling a multi-stage amplifier, the multi-stage amplifier comprised of a power amplifier driver and a power amplifier for amplifying an input signal into an amplified output signal, the power amplifier driver having a first and a second input, an output, and an amplification magnitude responsive to an amplifier control signal, the power amplifier coupled to a power source and having a first input coupled to the output of the power amplifier driver, a second input, an output, a saturation point, and a gate bias responsive to a gate voltage signal, the input signal coupled to the first input of the power amplifier driver, the amplifier control signal coupled to the second input of the power amplifier driver, the gate voltage signal coupled to the second input of the power amplifier, the amplified output signal having an output power level and coupled to the output of the power amplifier, the control circuitry comprising:

a directional coupler for electromagnetically coupling the amplified output signal from the output of the power amplifier without excessive loss;

a detector, responsive to the directional coupler, for generating a detected power output signal indicative of the output power level of the amplified output signal;

a microprocessor for generating a power output control signal comprised of a predetermined value dictating the output power level of the amplified output signal;

an integrator, coupled between the detector and an output of the microprocessor, for comparing the detected power output signal to the power output control signal;

a buffer, responsive to the integrator, for increasing or decreasing a magnitude of the amplifier control signal for setting the amplification magnitude of the power amplifier driver so that the output power level of the amplified output signal remains at a constant level; and an operational amplifier configuration, responsive to a voltage generated for dictating an increase or a decrease in the gate voltage signal via a comparison of the amplifier control signal and the power source to determine if the multi-stage amplifier is in saturation, for generating a negative magnitude of the gate voltage signal to operate the power amplifier at or near the saturation point for increased efficiency.

9. A method of controlling amplifying circuitry, the amplifying circuitry coupled to a power source and having a first, a second, and a third input, an output, a saturation point, a gate bias responsive to a gate voltage signal, and amplifying an input signal responsive to an amplifier control signal into an amplified output signal, the input signal coupled to the first input of the amplifying circuitry, the amplifier control signal coupled to the second input of the amplifying circuitry, the gate voltage signal coupled to the third input of the amplifying circuitry, the amplified output signal coupled to the output of the amplifying circuitry, the method of controlling the amplifying circuitry comprising the steps of:

(a) detecting a power level of the amplified output signal and generating a detected output power level signal;

(b) integrating the detected output power level signal and a power level control signal into the amplifier control signal;

(c) generating the amplifier control signal so that the amplified output signal remains constant; and (d) dynamically varying the gate voltage signal to a most negative operative magnitude such that the amplifying circuitry functions at or near the saturation point for increased efficiency.

10. A method of controlling amplifying circuitry in accordance with claim 9 wherein said step (d) of dynamically varying is preceded by the steps of:

determining if the saturation point of the amplifying circuitry has been reached by comparing the amplifier control signal to the power source;

increasing, responsive to determining that the saturation point has been reached, the gate voltage signal by a first predetermined increment; and decreasing, responsive to determining that the saturation point has not been reached, the gate voltage signal by a second predetermined increment.

11. A method of controlling amplifying circuitry in accordance with claim 10 wherein said step of decreasing is preceded by the step of:

determining if the gate voltage signal is less than a predetermined value.

12. A method of controlling amplifying circuitry in accordance with claim 9 further comprising the step of:

causing the amplifying circuitry to attenuate in a forward isolation mode.

13. A method of controlling amplifying circuitry of an RF communication device, the amplifying circuitry coupled to a power source and having a first and a second input, an output, a saturation point, a gate bias responsive to a gate voltage signal, and amplifying an input signal into an amplified output signal having one of a plurality of power levels, the input signal coupled to the first input of the amplifying circuitry, the gate voltage signal coupled to the second input of the amplifying circuitry, the amplified output signal coupled to the output of the amplifying circuitry, the method of controlling the amplifying circuitry comprising the steps of:

(a) causing the amplifying circuitry to attenuate in a forward isolation mode;

(b) boosting the amplifying circuitry, when the RF communication device is outside of a range of normal communications, such that the amplified output signal has a power level greater than the plurality of power levels to maintain communication; and (c) dynamically varying the gate voltage signal, when the RF communication device is functioning within the range of normal communications, for operating the amplifying circuitry as close to the saturation point as possible without preventing the amplifying circuitry from maintaining the amplified output signal at a preferred one of the plurality of power levels.

\* \* \* \* \*